(12) United States Patent
Auburger et al.

(10) Patent No.: US 7,211,468 B2
(45) Date of Patent: May 1, 2007

(54) METHOD FOR ENCAPSULATING A PLURALITY OF ELECTRONIC COMPONENTS

(75) Inventors: Bernhard Auburger, Burglengenfeld (DE); Klaus Bauer, Regensburg (DE); Ronald Henzinger, Dortmund (DE); Wighard Jäger, Spardorf (DE); Hermann Leiderer, Wörth/Donau (DE); Armin Rubey, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 75 days.

(21) Appl. No.: 10/765,584

(22) Filed: Jan. 26, 2004

(65) Prior Publication Data

US 2004/0157377 A1 Aug. 12, 2004

(30) Foreign Application Priority Data

Jan. 29, 2003 (DE) ............................... 103 03 449

(51) Int. Cl.
*H01L 21/00* (2006.01)
*H01L 23/28* (2006.01)
(52) U.S. Cl. .................................................. 438/112
(58) Field of Classification Search ................ 438/112
See application file for complete search history.

(56) References Cited

U.S. PATENT DOCUMENTS

| 4,784,872 A | 11/1988 | Moeller et al. |
| 4,828,901 A * | 5/1989 | Wank et al. ................... 428/76 |
| 5,167,556 A | 12/1992 | Stein |
| 6,560,110 B1 * | 5/2003 | Myers et al. ................ 361/705 |
| 2003/0170450 A1 * | 9/2003 | Stewart et al. .............. 428/343 |

FOREIGN PATENT DOCUMENTS

| DE | 199 40 458 A1 | 3/2001 |
| EP | 0 464 394 A2 | 1/1992 |
| WO | 01/14610 A2 | 3/2001 |

\* cited by examiner

*Primary Examiner*—W. David Coleman
(74) *Attorney, Agent, or Firm*—Laurence A. Greenberg; Werner H. Stemer; Ralph E. Locher

(57) ABSTRACT

A method for encapsulating the electronic component and a method for producing electronic components according to the method include coating the component with a coating material. The coating material is hardened and an assembly including the component and the coating is encapsulated in plastic. In particular, the coating can be accomplished by immersion. The electronic component includes the coating encapsulation of a coating material applied in a flowable condition and hardened and a plastic encapsulation encapsulating the coating.

16 Claims, 1 Drawing Sheet

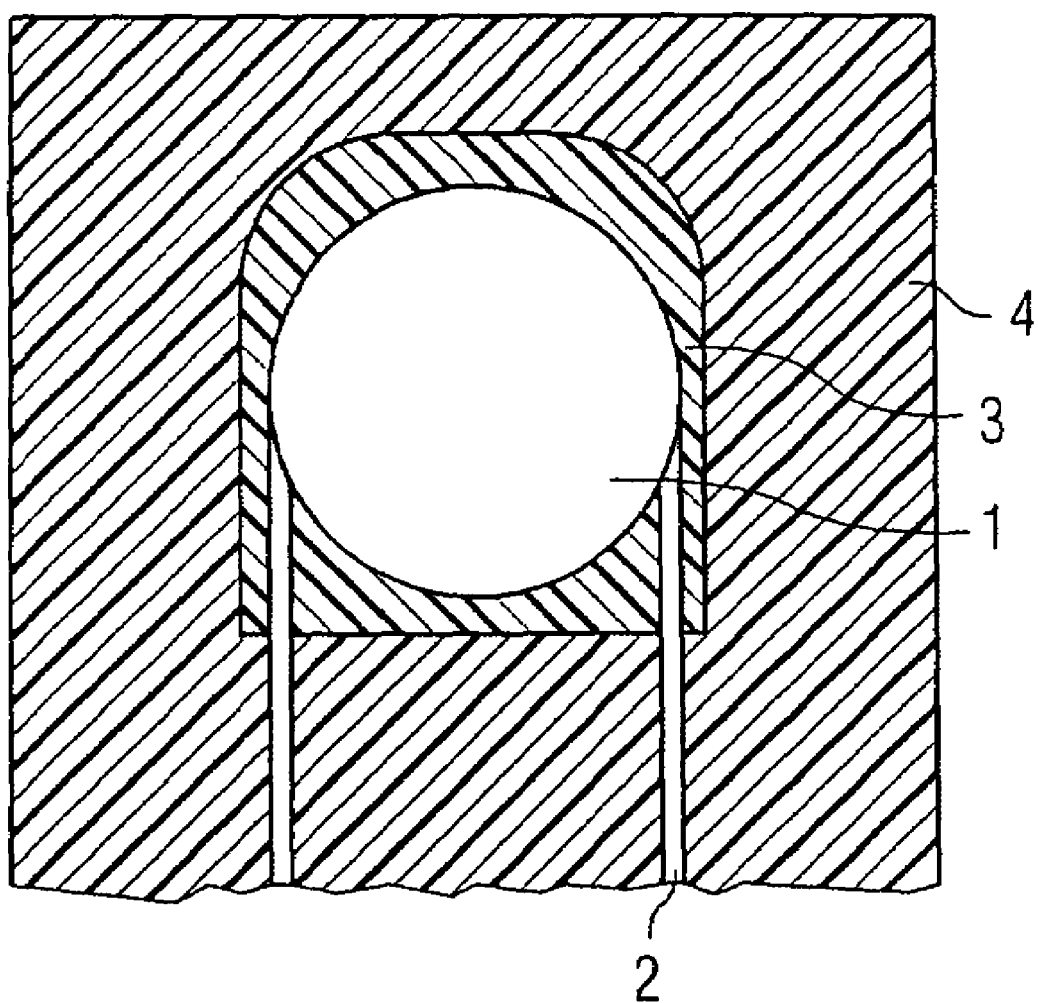

METHOD FOR ENCAPSULATING A PLURALITY OF ELECTRONIC COMPONENTS

BACKGROUND OF THE INVENTION

Field of the Invention

The invention relates to an electronic component, a method for encapsulating the electronic component, and a method for producing electronic components according to the method.

Electronic components such capacitors and resistors are frequently potted in an encapsulating material, in particular, plastic, i.e., surrounded by a plastic encapsulation. If these components are exposed to large temperature changes, high mechanical stresses may occur on the components due to different thermal coefficients of expansion of the materials involved. To avoid such a difficulty, a method is known from German Published, Non-Prosecuted Patent Application DE 34 08 855 A1 whereby the electronic component is surrounded by a shrink sleeve of at least 50% expandable very high tear strength, or rubber elastic very high tear strength, material. Such an encapsulation of the electronic component in a shrink sleeve is, however, not adequate for many applications.

The difficulty can also be overcome by avoiding complete encapsulation of the electronic component, but such a configuration is also unsatisfactory for many purposes.

SUMMARY OF THE INVENTION

It is accordingly an object of the invention to provide an electronic component, a method for encapsulating an electronic component, and a method for producing electronic components according to the method that overcome the hereinafore-mentioned disadvantages of the heretofore-known devices and methods of this general type and that compensates for the different thermal coefficients of expansion of the components and of the plastic encapsulating material despite a complete encapsulation of the component in plastic.

With the foregoing and other objects in view, there is provided, in accordance with the invention, a method for encapsulating an electronic component, including the steps of providing a component with a coating of a flowable coating material, hardening the material of the coating, and completely encapsulating the assembly of the component and the coating in plastic.

With the method in accordance with the invention, the component is coated with a flowable coating material before the complete encapsulation of the electronic component with plastic. The flowable coating material is chosen so that, in the hardened state, it can compensate for different rates of expansion of the component and plastic encapsulation due to temperature changes.

In accordance with another mode of the invention, the flowable coating material can be applied to the component by using a conventional coating method such as dipping, immersion, or spraying. Depending on the viscosity of the material, it can be useful to apply the coating material in several successive coating operations.

In accordance with a further mode of the invention, the components are joined together and the coating providing step is carried out by coating the plurality of components at the same time or sequentially.

In accordance with an added mode of the invention, the coating providing step is carried out by applying the coating material to the component by several successive coating operations.

In accordance with an additional mode of the invention, the hardening step is carried out by supplying external heat.

In accordance with yet another mode of the invention, the hardening step is carried out by drying under environmental conditions.

In accordance with yet a further mode of the invention, materials with high thermal coefficients of expansion and good adhesion properties are used as a coating material. Plastics from the polyurethane and silicone groups are preferred.

In accordance with yet an added mode of the invention, the assembly including the component and the coating is subjected to at least one further process operation before carrying out the plastic encapsulating step.

In accordance with yet an additional feature of the invention, the plastic encapsulating step is carried out by injection molding the assembly with PBT.

With the objects of the invention in view, there is also provided an electronic component, including a coating encapsulation of a flowable and hardened coating material and a plastic encapsulation encapsulating the coating.

With the objects of the invention in view, there is also provided an electronic component, including a component body, a coating encapsulating the body, the coating being of an originally flowable and later hardened material, and a plastic encapsulation encapsulating the coating.

With the objects of the invention in view, there is also provided an electronic component, including a coating encapsulation being of coating material applied in a flowable condition and hardened and a plastic encapsulation encapsulating the coating.

An important advantage of the method according to the invention is that a large number of components connected together can be coated at the same time. The method according to the invention also enables the assembly, including the component and the coating, to undergo at least one further process before encapsulating with plastic.

The method according to the invention is, thus, characterized not only by great simplicity but also by high flexibility.

Other features that are considered as characteristic for the invention are set forth in the appended claims.

Although the invention is illustrated and described herein as embodied in an electronic component, a method for encapsulating the electronic component, and a method for producing electronic components according to the method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

The FIGURE is a fragmentary, cross-sectional view of an electronic component according to the invention.

DESCRIPTION OF THE PREFERRED EMBODIMENTS

Referring now to the single FIGURE of the drawing, it is seen that an electronic component 1, in particular, can be constructed as a capacitor or resistor and, for example, is used in pressure or air mass sensors in internal combustion engines in automotive engineering. The component 1 is, normally, provided with connecting wires 2 (component pins).

To provide the component 1 with an encapsulation, first, the component 1 is coated with a coating 3 of flowable coating material. Preferably, polyurethane (PU) is used as the coating material. However, silicone or a different coating material with a high thermal coefficient of expansion and good adhesive properties can also be used.

The coating material is applied in a liquid state to the component 1, preferably, by immersing the component 1 in a non-illustrated immersion bath. Other coating methods such as spraying or painting can also be used.

A large number of components 1 (e.g., two thousand) can also be suitably coated with the coating 3 by connecting the components using a "belt" in the form of a paper strip, for example, and immersing the components 1 together in the immersion bath. The belt can be in the shape of a meander or a spiral.

If the coating material is of very low viscosity, it may be necessary, or at least appropriate, to use several successive immersion operations. The deciding factor is that the coating 3 must completely cover the component 1 and have a thickness sufficient to compensate for the different rates of thermal expansions between component 1 and a plastic encapsulation 4 to be applied later.

After the immersion (if necessary after the last immersion), drying cures the coating. The drying operation can be by an external heat supply in the form of infrared radiation and/or hot air. Drying under environmental conditions is also possible, depending on the coating materials used.

An important advantage of the method described is that the coating and curing operations can be carried out before the electronic component 1 undergoes its own processing. For example, the electronic component 1 can be welded to a non-illustrated conductor comb after immersing and drying and, if necessary, subjected to further processes before the assembly, being composed of the component 1 and coating 3, is provided with the plastic encapsulation 4.

The plastic encapsulation 4 can, to some extent, be applied in two stages. For example, component 1 can be encapsulated by injection molding after the conductor comb is welded on. The welded components are, then, segregated by separating the conductor comb, and the assemblies thus produced are, again, encapsulated in plastic by injection molding. Polybutylene teraphthalate (PBT) is the preferred plastic.

As tests have shown, the coating 3 applied in the described manner can compensate for relatively large differences in thermal expansion between the component 1 and the plastic encapsulation 4.

We claim:

1. A method for encapsulating a plurality of electronic components, which comprises:
   joining a plurality of components together;
   coating the plurality of components at the same time for providing the plurality of components with a coating of a flowable coating material;
   hardening the material of the coating;
   subjecting the assembly including the plurality of components and the coating to at least one further process operation, the at least one further process operation being a welding of the plurality of components to a conductor comb; and
   subsequent to the welding of the plurality of components to a conductor comb, completely encapsulating the assembly of the plurality of components and the coating in plastic.

2. The method according to claim 1, which further comprises applying the coating material to the plurality of components by immersion.

3. The method according to claim 1, which further comprises carrying out the coating providing step by immersing the plurality of components in the coating material.

4. The method according to claim 1, which further comprises applying the coating material to the plurality of components by spraying.

5. The method according to claim 1, which further comprises carrying out the coating providing step by spraying the coating material on the plurality of components.

6. The method according to claim 1, which further comprises carrying out the coating providing step by applying the coating material to the plurality of components by several successive coating operations.

7. The method according to claim 1, which further comprises carrying out the hardening step by supplying external heat.

8. The method according to claim 1, which further comprises carrying out the hardening step by heating the coating.

9. The method according to claim 1, which further comprises carrying out the hardening step by drying under environmental conditions.

10. The method according to claim 1, which further comprises providing coating material of the coating with a high coefficient of expansion and good adhesion properties.

11. The method according to claim 1, which further comprises selecting the coating material from a plastic selected from the group consisting of polyurethane and silicone.

12. The method according to claim 1, which further comprises carrying out the plastic encapsulating step by injection molding the assembly with PBT.

13. The method according to claim 1, which further comprises carrying out the plastic encapsulating step by encapsulating the assembly by injection molding PET.

14. The method according to claim 1, wherein the completely encapsulating step is achieved by injection molding.

15. The method according to claim 10, which further comprises selecting the coating material from a plastic selected from the group consisting of polyurethane and silicone.

16. The method according to claim 14, further comprising separating the plurality of components by separating the conductor comb and encapsulating the separated components with a further encapsulation by injection molding.

* * * * *